United States Patent
Sun et al.

(10) Patent No.: US 8,465,655 B1
(45) Date of Patent: Jun. 18, 2013

(54) METHOD OF MANUFACTURING POLYMER NANOPILLARS BY ANODIC ALUMINUM OXIDE MEMBRANE AND IMPRINT PROCESS

(75) Inventors: Hongwei Sun, Lexington, MA (US); Sai Liu, Columbia, MO (US)

(73) Assignee: University of Massachusetts, Boston, MA (US)

( * ) Notice: Subject to any disclaimer, the term of this patent is extended or adjusted under 35 U.S.C. 154(b) by 0 days.

(21) Appl. No.: 13/413,358

(22) Filed: Mar. 6, 2012

(51) Int. Cl.
*C25F 3/00* (2006.01)

(52) U.S. Cl.
USPC .................. 216/11; 216/42; 216/44; 216/54

(58) Field of Classification Search
USPC .......................................... 216/11, 42, 44, 54
See application file for complete search history.

(56) References Cited

U.S. PATENT DOCUMENTS

| | | | |
|---|---|---|---|
| 2009/0242405 A1 | 10/2009 | Mayer et al. | |
| 2009/0242416 A1 | 10/2009 | Yun et al. | |
| 2010/0090341 A1 | 4/2010 | Wan et al. | |
| 2010/0145491 A1 | 6/2010 | Troian | |
| 2011/0008484 A1 | 1/2011 | Lee | |
| 2011/0300339 A1* | 12/2011 | Ho et al. | 428/156 |
| 2011/0300345 A1* | 12/2011 | Bessonov et al. | 428/195.1 |
| 2012/0088159 A1* | 4/2012 | Thomas et al. | 429/231.8 |
| 2012/0138567 A1* | 6/2012 | Hirano et al. | 216/22 |
| 2012/0302465 A1* | 11/2012 | Elmouelhi et al. | 506/20 |

FOREIGN PATENT DOCUMENTS

WO 2007039188 A1 4/2007

OTHER PUBLICATIONS

Choi, S. et al., Growth and Engineering of High Aspect-Ratio AAO Templates Integrated on Silicon Substrates, Nanotech 2007 Conference, Santa Clara, CA.
Chou, P. et al., Imprint Lithography with 25-Nanometer Resolution, Science, 1996, vol. 272, No. 5258, pp. 85-87.
Fang, T., et al., Nanomechanical and surface behavior of polydimethylsiloxane-filled nanoporous anodic alumina, J. Mater Sci (2009) 44:1588-1593.
Levit, N. et al., High Surface Area Polymer Coatings for SAW-based Chemical Sensor Application, Sensor and Acurators B, vol. 82, 2002, pp. 241-249.
Liu, S. et al., Dynamic Chemical Vapor Sensing With Nanofibrous Film Based Surface Acoustic Wave Sensors, Sensors and Actuators A, vol. 167, Iss.1, pp. 8-13.

(Continued)

*Primary Examiner* — Binh X Tran
(74) *Attorney, Agent, or Firm* — John H. Pearson, Jr., Esq.; Walter F. Dawson, Esq.; Pearson & Pearson, LLP.

(57) ABSTRACT

A fabrication method for forming polymer nanopillars using an anodic aluminum oxide (AAO) membrane and an imprint process. A substrate is cleaned and a water soluble tape is applied to the substrate to define a coating area. The substrate is spin-coated with a polymer solution and an AAO membrane is placed on top of the coated area on the substrate and turned over whereby a silicon wafer is attached onto the AAO membrane forming an AAO membrane assembly, which is pressed in an imprintor. Then, the AAO membrane assembly is removed from the imprintor, it is disassembled, and the AAO membrane is dissolved in a NaOH solution forming a polymer substrate with nanopillars.

16 Claims, 2 Drawing Sheets

OTHER PUBLICATIONS

Thompson, M. et al., Response Selectivity of Etched Surface Acoustic Wave Sensors, Analytica Chimica Acta, vol. 248 1991, pp. 143-153.

Tseng, A. A., Nanofabrication: Fundamentals and Applications, World Scientific, Mar. 4, 2008.

Zhong, W.X. et al., Highly Ordered TiO2 Nano-pore Arrays Fabricated From a Novel Polymethylmethacrylate/polydimethsiloxane Soft Template, Nano-Micro Letters, 2010, vol. 2, No. 1, pp. 1-5.

* cited by examiner

METHOD OF MANUFACTURING POLYMER NANOPILLARS BY ANODIC ALUMINUM OXIDE MEMBRANE AND IMPRINT PROCESS

FEDERALLY SPONSORED RESEARCH

This invention was made with U.S. Government support under Grant No. CMMI-0923403 awarded by the National Science Foundation. The U.S. Government has certain rights in the invention.

BACKGROUND OF THE INVENTION

1. Field of the Invention

This invention relates generally to a method of fabricating polymer nanopillars, and in particular to a method of fabricating polymer nanopillars using an anodic aluminum oxide (AAO) membrane and an imprint process.

2. Description of Related Art

Coating approaches including spray coating, surface etching and electrospinning provide nanostructural patterning. These coatings provide much higher surface area for analyte absorption and desorption than solid film coating, and reduce diffusion length due to nanoscale polymer thickness thereby improving the sensitivity significantly. However, the existing nanostructural coating approaches are not able to accurately control the coating parameters such as porosity, thickness, and geometry and especially to provide uniform nanostructure patterns with polymer materials. On the other hand they are expensive and need sophisticated equipment and complex procedure. Especially the random nanopatterns cannot guaranty a repeatable performance for applications such as sensors even though it was fabricated under the same procedures.

Nanoimprint lithography (NIL) was first developed by Chouet al., "Imprint Lithography with 25-NANOMETER Resolution", Science 1996, Vol. 272, No. 5258, pp. 85-87. Although it has a history of just 15 years, NIL has rapidly developed because of providing repeatable and low cost approach for nanostructural patterning. The NIL needs two basic parts: a master mold with nanostructure pattern and a substrate coated with imprint resist (thermal or UV resist) coating. By controlling the temperature and pressure between master mold and the substrate, the nanostructure pattern can be transferred from the mold to the resist layer on the substrate. Comparing to the traditional nanoscale fabrication methods such as electrospinning process (see S. Liu et al., "Dynamic Chemical Vapor Sensing With Nanofibers Film Based Surface Acoustic Waves Sensors, Sensors and Actuators A.", Vol. 167, Iss. I, pp. 8-13.), the nanoimprint coating approach is much easier for control of thickness, pattern geometry and locating.

U.S. Patent Application Publication No. US2010/0145491 dated Jun. 10, 2010 discloses a method and apparatus for the controlled fabrication of micro and nanoscale structures as by thermocapillary, lithography. The growth and evolution of 2D and 3D structures are controllably stimulating from a thin film mass transfer process such that complex devices can be designed and fabricated having engineered features of different height and separation distances in a single or few process steps. However, the length of the nanopillars is limited to a few hundreds of nanometers whereas in the present invention, the nanopillars can be fabricated up to a few microns. Also, the length and size of these nanopillars are limited by the type of polymers and the surface tension of the polymers.

U.S. Patent Application Publication No. US2011/0008484 dated Jun. 13, 2011 discloses a method for forming a nanoimprint mold, comprising the steps of filing nanoholds formed in a substrate with a material to form nanopillars on the substrate, performing at least a first partial oxidation of the nanopillars and then removing at least a portion of the oxidized material, depositing a hard substance on the nanopillars to begin forming the nanoimprint mold on the nanopillars, depositing a second material on the hard substrate, and removing the substrate from a molding surface of the nanoimprint mold. However, the holes on the mold usually are shallow and then the nanopillars are short in size (less than 400 nm), but the present invention can form both short and long nanopillars/wires depending on pressure such as a few micrometers. Also, the density of the nanopillars formed by this method is low.

SUMMARY OF THE INVENTION

Accordingly, it is therefore an object of this invention to provide apparatus and a method for fabricating nanopillars using an AAO membrane and an imprint process.

It is another object of this invention to provide a method of manufacturing large scale polymer nanopillars with sizes varying from micrometers to centimeters.

It is yet another object of this invention to fabricate repeatable polymer nanopillars with easy procedures including imprint and chemical treatment.

It is a further object of this invention to manufacture polymer nanopillars on a different polymer substrate.

These and other objects are further accomplished by a method for forming polymer nanopillars comprising the steps of providing a first substrate, performing a spin-coating with a polymer solution on the first substrate, positioning an AAO membrane on top of the first substrate of the coated polymer coating, turning over the first substrate with the AAO membrane onto a second substrate forming an AAO assembly, performing an imprint process on the AAO assembly with means for accurately controlling temperature and pressure, disassembling the AAO assembly after the imprint process, and dissolving the AAO membrane in a NaOH solution leaving the nanopillars formed on the first substrate. The step of providing a first substrate includes the step of providing a quartz substrate. The method comprises the step of cleaning the first substrate to remove any organic residue. The step of providing a first substrate comprises the step of applying a water soluble tape over the first substrate to restrict an area of the first substrate being coated. The method comprises the step of prebaking the coated first substrate at a predetermined temperature below a glass transition temperature of the polymer for removing a solvent in the polymer coating. The method comprises the step of coating the second substrate with a release agent prior to forming the AAO assembly. The step of turning over the first substrate onto a second substrate forming an AAO assembly comprises the step of providing a silicon wafer for the second substrate. The step of performing the imprint process on the AAO assembly comprises the steps of setting an imprint temperature at approximately 200° C., setting an imprint chamber pressure at approximately 50 psia, and setting a nanoimprint time of approximately two (2) minutes. The step of performing a spin-coating with a polymer solution comprises the step of providing a polymer solution from one of a group consisting of polymethyl methacrylate (PMMA), polyurethane (PU), polydimethylsiloxane, (PDMS) and polyacrylonitrile (PAN).

The objects are further accomplished by a method for forming polymer nanopillars comprising the steps of providing a first substrate, the first substrate having been cleaned to remove organic residue, applying a water soluble tape over the first substrate to restrict a coating area, performing a spin-coating with a polymer solution onto the first substrate in the restricted coating area, prebaking the coated first substrate at a predetermined temperature below a glass transition temperature of the polymer coating for removing a solvent in the polymer coating, positioning an AAO membrane on top of the first substrate in the area of the polymer coating, turning over the first substrate with the AAO membrane onto a second substrate forming an AAO assembly, placing the AAO assembly in a nanoimprintor at a predetermined glass transition temperature of the polymer coating and predetermined pressure, removing the AAO assembly from the nanoimprintor and disassembling the AAO assembly, and dissolving the AAO membrane in a NaOH solution leaving the nanopillars formed on the first substrate. The step of providing a first substrate includes the step of providing a quartz substrate. The method comprises the step of cleaning the first substrate to remove any organic residue. The method comprises the step of coating the second substrate with the release agent prior to forming the AAO assembly. The step of turning over the first substrate onto a second substrate forming an AAO assembly comprises the step of providing a silicon wafer for the second substrate. The step of performing the imprint process in the nanoimprintor on the AAO assembly comprises the steps of setting an imprint temperature at approximately 200° C., setting an imprint chamber pressure at approximately 50 psia, and setting a nanoimprint time of approximately two (2) minutes. The step of performing a spin-coating with a polymer solution comprises the step of providing the polymer solution from one of a group consisting of polymethyl methacrylate (PMMA), polyurethane (PU), polydimethylsiloxane, (PDMS) and polyacrylonitrile (PAN).

Additional objects, features and advantages of the invention will become apparent to those skilled in the art upon consideration of the following detailed description of the preferred embodiment exemplifying the best mode of carrying out the invention as presently perceived.

BRIEF DESCRIPTION OF THE DRAWINGS

The appended claims particularly point out and distinctly claim the subject matter of this invention. The various objects, advantages and novel features of this invention will be more fully apparent from a reading of the following detailed description in conjunction with the accompanying drawings in which like reference numerals refer to like parts, and in which:

DESCRIPTION OF ILLUSTRATIVE EMBODIMENT

Figure 1A:
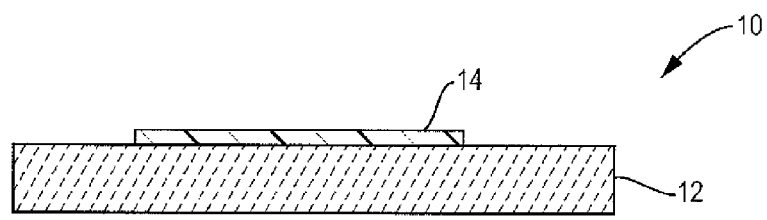
FIG. 1A shows a quartz substrate spin-coated with a polymer solution.

Referring to FIGS. 1A to 1E, the steps of a method for manufacturing polymer nanopillars 20 are illustrated using an anodic aluminum oxide (AAO) membrane and an imprint process. FIG. 1A shows a substrate 12 which may be made of quartz or silicon or any type of flat substrate, and the substrate 12 is cleaned with acetone, methanol and isopropanol (Alfa Aesar) followed by an oxygen plasma treatment to remove any organic residue on the substrate 12. Another purpose of the plasma cleaning is to enhance the polymer film or coating adhesion to the substrate 12. In order to control and restrict the polymer coating area, a water soluble wave solder tape (3M 5414) is applied to the substrate 12 to restrict the coating area. After polymer coating, the tape is dissolved in DI water for less than 40 minutes and the substrate is dried in vacuumed oven under 40° C. and 5 psi for 30 minutes. The nanoimprint resist solution is critical for the success of this process and ideally should have the following features: 1) enough mechanical hardness for mold imprinting; 2) the solution has a hydrophilic property with the substrate so that it can remain on the substrate during a spinning process and form a uniform film.

The substrate 12 is spin-coated with a polymer solution such as Poly methyl methacrylate (PMMA) and then prebaked on the substrate 12 at a temperature below the glass transition temperature of the chosen polymer, which is 150° C. for PMMA, for 1 minute to remove any solvent. Other polymers may be used for spin-coating the substrate 12 such as polyacrylonitrile (PAN), polydimethylsiloxane (PDMS), and polyurethane (PU), depending on their applications. A solution with 10 wt % concentration of Poly methyl methacrylate (PMMA) in Chloroform manufactured by Alfa Aesarof, Ward Hill, Mass. (CAS: 67-66-3) was prepared and spin-coated on the quartz substrate at the speed of 8000 rpm for 30 second for uniform thickness of the polymer coating.

Figure 1B:
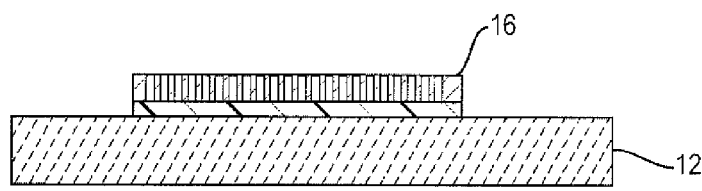
FIG. 1B shows an AAO membrane attached to the polymer coated surface of the quartz substrate of FIG. 1A.

Referring to FIG. 1B, an AAO membrane 16 such as one made by G.E. Healthcare, is attached on top of the substrate 12 on the surface of the coated polymer film 14 where the nanopillars 20 will be formed. Anodic alumina oxide (AAO) membrane is a self-organized nanostructured material containing a high density of uniform cylindrical pores that are aligned perpendicular to the surface of the materials and penetrate its entire thickness. A regular porous structure is formed when aluminum is electrochemically oxidized (anodized) in certain acid solutions.

Figure 1C:
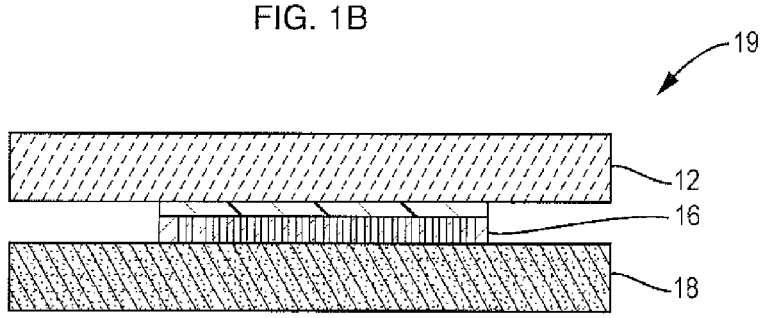
FIG. 1C shows the quartz substrate and AAO membrane of FIG. 1B turned over onto a silicon substrate forming an AAO assembly in preparation for a nanoimprint process.

Referring to FIG. 1C, the substrate 12 with the AAO membrane 16 is flipped over onto a silicon wafer or second substrate 18 forming an AAO membrane assembly 19. The silicon wafer 18 coated with a release agent (RA) is attached to the AAO membrane 16. The release agent provides for easy separation of the substrate 12 with AAO membrane 16 from the silicon wafer 18. The release agent comprises tridecafluoro-(1,1,2,2)-tetrahyrooctyl-trichlorosilane (F13-TCS), CAS No:78560-45-9. F13-TCS is very sensitive to humidity, and a dry environment condition is necessary during the coating process. The RA solution in a petri dish is placed on a hotplate under 250° C. for 2 hours in order to fully cover the silicon surface.

Figure 1D:
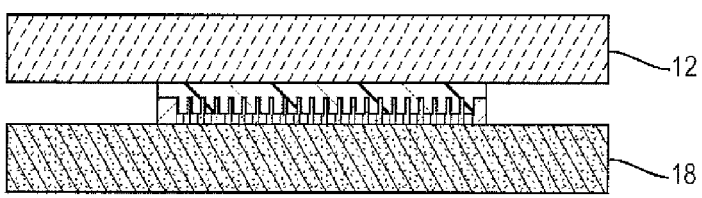
FIG. 1D illustrates the nanoimprinting process occurring at a predetermined temperature and pressure.

Referring to FIG. 1D, the imprinting process includes the assembly 19 of the substrate 12, AAO membrane 16 and silicon wafer 18 being pressed in equipment which can accurately control temperature (from 20° C. to 500° C.) and pressure (from 0 psi to 500 psi) such as a nanoimprintor at the glass transition temperature of the PMMA polymer which is 200° C. The nanoimprintor may be embodied by Model NX2600, manufactured by Nanonex of Monmouth Jct., N.J. The NX2600 can provide the temperature and pressure controls needed for the imprinting process. During the imprinting process, the imprint temperature is set at 200° C. under pressure of 50 psia. Imprint time is set at 2 minutes in order improve the flow of the polymer coating inside the pores of AAO membrane 16. The optimized nanoimprint process parameters are listed in Table 1.

TABLE 1

| | |
|---|---|
| Cylinder pressure | 250 psi |
| Chamber pressure | 50 psi |
| Pre-temperature | 130° C. |
| Imprint temperature | 200° C. |
| Vent temperature | 55° C. |
| Vacuum time | 2 minutes |
| Imprint time | 2 minutes |

Figure 1E:
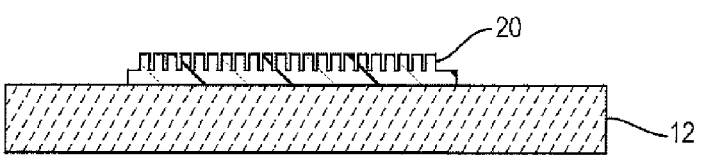
FIG. 1E shows the disassembled quartz substrate with released nanopillars after dissolving the AAO membrane in a NaOH solution.

Referring to FIG. 1E, the polymer nanopillars 20 are formed on the quartz substrate 18 by dissembling the AAO assembly 19 in FIG. 1D and dissolving the AAO membrane 16 in a solution with a concentration of 5 wt % of NaOH in DI water for AAO fast etching. It takes an average of 30 to 50 minutes for the etching process depending on the polymer thickness and imprint pressure. A longer time is needed for thicker AAO film. The basic reaction between NaOH and AAO is described as: $20H^- + AL_2O_3 \rightarrow 2ALO_2^- + H_2O$.

Figure 2:
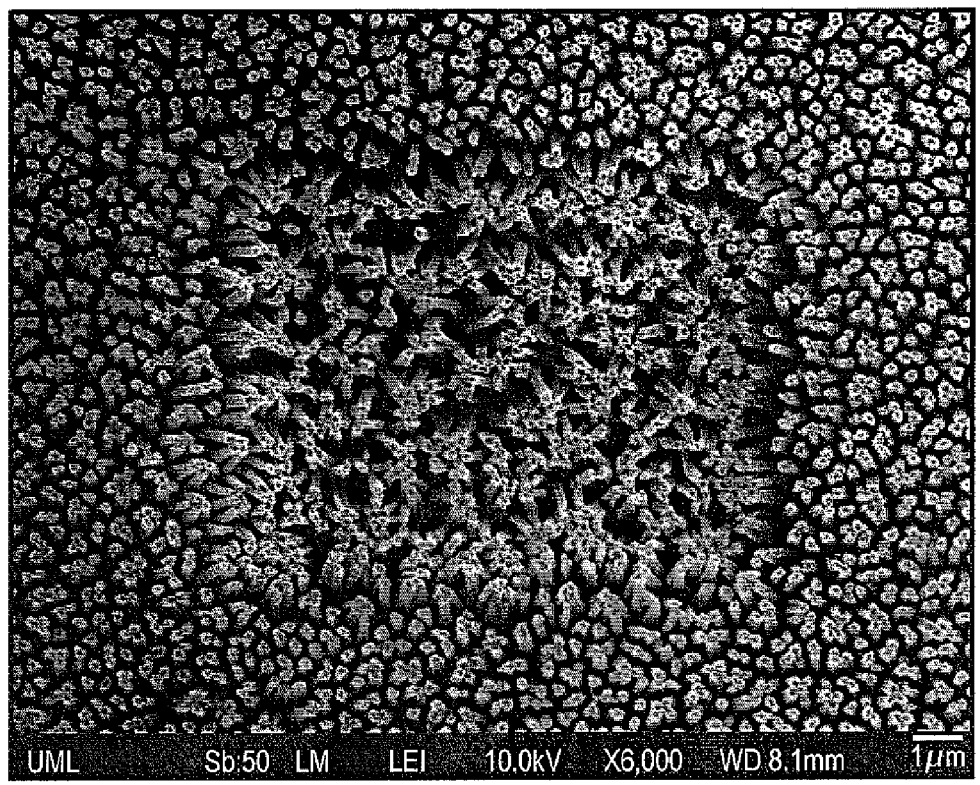
FIG. 2 shows a SEM image of a PMMA nanopillar fabricated by the method of FIGS. 1A-1E.

Referring to FIG. 2, a field emission scanning electron microscope (SEM) image of the PMMA nanopillar 20 is shown fabricated by the above method as illustrated in FIGS. 1A to 1E. The PMMA nanopillars have an average diameter of 206 nm and a length of approximately 6 μm, and are uniformly aligned on the surface of substrate.

Figure 3:
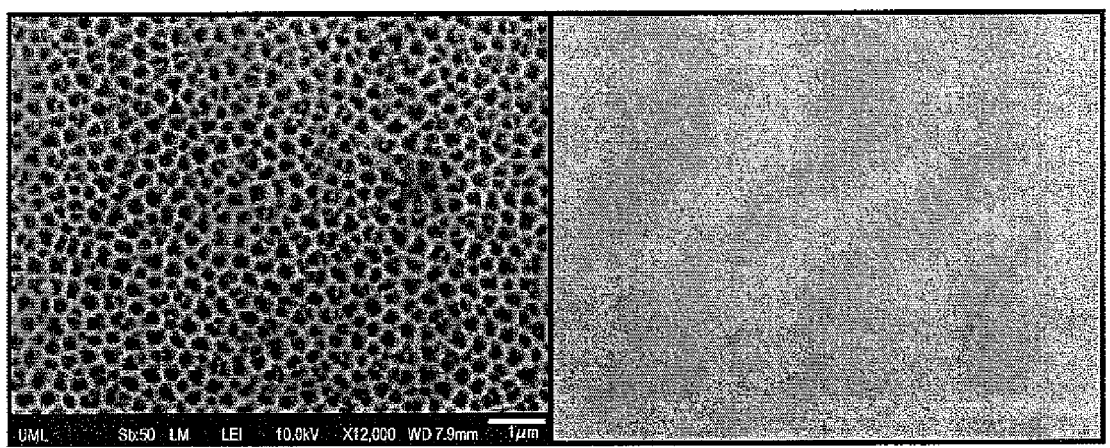
FIG. 3 shows a SEM image of an AAO membrane on the left half of the photo and an actual AAO membrane on the right half of the photo.

Referring to FIG. 3, a SEM image of the AAO membrane is shown on the left half of the photo and the actual AAO membrane is shown on the right half of the photo. The nanoscale pores uniformly distribute over the membrane surface and the film has a pore size of approximately 230 nm and the average porosity is approximately 0.5 (50%). The thickness of the AAO membrane is approximately 10 micrometers (μm).

The advantages of using the AAO membrane 16 as the imprinting mold include: 1) nanoscale pores with uniform size distribution; 2) a wide range of pore size and pitch between pores are commercially available (10 nm to 500 nm); 3) nanopillars/wire with a highly controllable ratio of length to diameter can be achieved by using imprinting method; and 4) easy to define the coating area with low cost.

In addition, this novel fabrication process of applying the imprint process using the AAO membrane 16 as the imprint mold to provide nanopillar polymer coating 14 on the substrate 12 provides the following benefits of: 1) Large scale polymer nanopillar (10 nm to 500 nm) manufacturing with sizes ranging from micrometers to centimeters; 2) Fabricate repeatable polymer nanopillars with easy procedures including one step imprint and chemical treatment; and 3) Low cost with AAO membranes costing a few dollars and chemical consumption at extremely low price.

This invention has been disclosed in terms of a particular embodiment. It will be apparent that many modifications can be made to the disclosed apparatus without departing from the invention. Therefore, it is the intent of the appended claims to cover all such variations and modifications as come within the true spirit and scope of this invention.

What is claimed is:

1. A method for forming polymer nanopillars comprising the steps of:
   providing a first substrate;
   performing a spin-coating with a polymer solution on said first substrate;
   positioning an anodic aluminum oxide membrane on top of said first substrate of said coated polymer coating;
   turning over said first substrate with said anodic aluminum oxide membrane onto a second substrate forming an anodic aluminum oxide assembly;
   performing a nanoimprint process on said anodic aluminum oxide assembly with means for accurately controlling temperature and pressure;
   disassembling said anodic aluminum oxide assembly after said nanoimprint process; and
   dissolving said anodic aluminum oxide membrane in a NaOH solution leaving said polymer nanopillars formed on said first substrate.

2. The method as recited in claim 1 wherein said step of providing a first substrate includes the step of providing a quartz substrate.

3. The method as recited in claim 1 wherein said method comprises the step of cleaning said first substrate to remove any organic residue.

4. The method as recited in claim 1 wherein said step of providing a first substrate comprises the step of applying a water soluble tape over said first substrate to restrict an area of said first substrate being coated.

5. The method as recited in claim 1 wherein said method comprises the step of prebaking said spin coated first substrate at a predetermined temperature below a glass transition temperature of said polymer for removing a solvent in said polymer coating.

6. The method as recited in claim 1 wherein said method comprises the step of coating said second substrate with a release agent prior to forming said anodic aluminum oxide assembly.

7. The method as recited in claim 1 wherein said step of turning over said first substrate onto a second substrate forming an anodic aluminum oxide assembly comprises the step of providing a silicon wafer for said second substrate.

8. The method as recited in claim 1 wherein said step of performing said nanoimprint process on said anodic aluminum oxide assembly comprises the steps of:
   setting an imprint temperature at approximately 200° C.;
   setting an imprint chamber pressure at approximately 50 psia; and
   setting a nanoimprint time of approximately two (2) minutes.

9. The method as recited in claim 1 wherein said step of performing a spin-coating with a polymer solution comprises the step of providing said polymer solution from one of the group consisting of polymethyl methacrylate (PMMA), polyurethane (PU), polydimethylsiloxane, (PDMS) and polyacrylonitrile (PAN).

10. A method for forming polymer nanopillars comprising the steps of:
   providing a first substrate, said first substrate having been cleaned to remove organic residue;
   applying a water soluble tape over said first substrate to restrict a coating, area;
   performing a spin-coating with a polymer solution onto said first substrate in said restricted coating area;
   prebaking said spin coated first substrate at a predetermined temperature below a glass transition temperature of said polymer coating for removing a solvent in said polymer coating;
   positioning an anodic aluminum oxide membrane on top of said first substrate in the area of said polymer coating;
   turning over said first substrate with said anodic aluminum oxide membrane onto a second substrate forming an AAO anodic aluminum oxide assembly;

placing said anodic aluminum oxide assembly in a nanoimprintor at a predetermined glass transition temperature of said polymer coating and a predetermined pressure;

removing said anodic aluminum oxide assembly from said nanoimprintor and disassembling said anodic aluminum oxide assembly;

dissolving said anodic aluminum oxide membrane in a NaOH solution leaving said nanopillars formed on said first substrate.

11. The method as recited in claim 10 wherein said step of providing a first substrate includes the step of providing a quartz substrate.

12. The method as recited in claim 10 wherein said method comprises the step of cleaning said first substrate to remove any organic residue.

13. The method as recited in claim 10 wherein said method comprises the step of coating said second substrate with the release agent prior to forming said anodic aluminum oxide assembly.

14. The method as recited in claim 10 wherein said step of turning over said first substrate onto a second substrate forming an anodic aluminum oxide assembly comprises the step of providing a silicon wafer for said second substrate.

15. The method as recited in claim 10 wherein said step of performing said imprint process in said nanoimprintor on said anodic aluminum oxide assembly comprises the steps of:

setting an imprint temperature at approximately 200° C.;

setting an imprint chamber pressure at approximately 50 psia; and setting a nanoimprint time of approximately two (2) minutes.

16. The method as recited in claim 10 wherein said step of performing a spin-coating with a polymer solution comprises the step of providing said polymer solution from one of the group consisting of polymethyl methacrylate (PMMA), polyurethane (PU), polydimethylsiloxane, (PDMS) and polyacrylonitrile (PAN).

* * * * *